United States Patent
Schwabe

[11] 3,977,925
[45] Aug. 31, 1976

[54] METHOD OF LOCALIZED ETCHING OF Si CRYSTALS

[75] Inventor: Ulrich Schwabe, Munich, Germany

[73] Assignee: Siemens Aktiengesellschaft, Berlin & Munich, Germany

[22] Filed: Nov. 27, 1974

[21] Appl. No.: 527,894

[30] Foreign Application Priority Data

Nov. 29, 1973    Germany............................. 2359511

[52] U.S. Cl.................................. 156/13; 29/580; 156/17; 252/79.3; 427/88
[51] Int. Cl.².......................................... H01L 21/31
[58] Field of Search ...................... 156/7, 8, 13, 17; 252/79.2, 79.3; 29/576 IW, 580; 427/88

[56] References Cited
UNITED STATES PATENTS

| | | |
|---|---|---|
| 3,680,205 | 8/1972 | Kravitz............................ 156/17 |
| 3,749,619 | 7/1973 | Muraoka et al. ....................... 156/17 |
| 3,796,612 | 3/1974 | Allison................................ 156/17 |
| 3,810,796 | 5/1974 | Skaggs et al. ........................... 156/8 |
| 3,839,111 | 10/1974 | Ham et. al........................ 252/79.3 |
| 3,929,531 | 12/1975 | Hattori et. al.................. 252/79.3 |

Primary Examiner—Douglas J. Drummond
Assistant Examiner—Jerome W. Massie
Attorney, Agent, or Firm—Hill, Gross, Simpson, Van Santen, Steadman, Chiara & Simpson

[57] ABSTRACT

A Si crystal substrate is orientated so that the 100-plane of the crystal lattice coincides with a surface thereof to be etched, and etch-resistant material such as composed of $Si_3N_4$, Ta, etc. is coated onto selected areas of the surface to be etched and an etchant composed of a mixture containing for each 100 gr of $HNO_3$, 20 gr of $H_2O$, 4 gr of HF and 110 gr of $CH_3COOH$ is applied onto the surface to be etched for a period of time sufficient to produce a groove or recess having a relatively gradually sloped side wall in relation to the (100) surface being etched.

5 Claims, 2 Drawing Figures

METHOD OF LOCALIZED ETCHING OF SI CRYSTALS

BACKGROUND OF THE INVENTION

1. Field of the Invention

The invention relates to localized etching of Si crystals and somewhat more particularly to an etching method for such crystals which provides relatively gradually sloped side walls for the depressions or grooves etched in the surfaces thereof.

2. Prior Art

Hunter, "Handbook of Semiconductor Electronics," 1956, pages 3–8 suggests that an etching solution for Si or Ge substrates may comprise a mixture of HF and $HNO_3$ and may include glacial acetic acid as a moderator and bromine as an accelerator. A commercially available etchant of this general type is available under the trade name CP4, which comprises a mixture of equal parts of concentrated (46%) HF and $CH_3COOH$ (glacial acetic) to which 3 parts of concentrated $HNO_3$ are added.

However, when such known etchant is used to produce grooves or trenches on Si substrates, disadvantages result. For example, during the production of elements of an integrated circuit on an epitaxial layer of one conductor type on a Si substrate of another conductor type, it is common to etch a groove or trench between each adjacent element so as to completely sever the epitaxial layer in order to suppress parasitic currents between the various elements. Thereafter, an insulator layer is provided within such a groove and extends over the edges thereof to the contact points of each individual element of the integrated circuit. Then conductor path is supplied to provide the necessary electrical linkage between the various elements of the integrated circuit.

However, as is known, such conductor paths frequently become ruptured or interrupted at the groove periphery when such grooves are produced with conventional etchants, such as CP4. An explanation of this prior art defect is shown at FIG. 1. This partial cross-sectional view illustrates an etch profile of a groove or hole in a Si substrate produced by $CP_4$ through a suitable etch mask, for example composed of $Si_3N_4$. As can be seen, the profile begins with a very steep slope having an angle of declanation of about 90°. When the Si surface within and outside such a groove is oxidized after removal of the $Si_3N_4$ mask so that a $SiO_2$ protective layer forms thereon and one attempts to provide a conductor path across the groove for connecting the semiconductor elements on opposite sides thereof, an interruption or rupture in such conductor paths usually occurs at the upper edge of the groove, due to the steep angle of the groove side walls.

SUMMARY OF THE INVENTION

The invention provides a method of etching Si substrates which substantially eliminates the aforesaid prior art drawbacks.

In accordance with the principles of the invention, a Si substrate is orientated so that the 100-plane of the Si crystal lattice generally coincides with a surface of the substrate to be etched, a suitable etch mask is applied to such surface and an etchant comprised of a mixture which contains for each 100 gr of $HNO_3$, 20 gr ± 50% of $H_2O$, 4 gr ± 100 of HF and with 110 gr ± 20% of $CH_3COOH$ is added to such surface while the temperature thereof is maintained at about 18° to 30°C for a period of time sufficient to produce a desired etch groove pattern on the surface. Each resultant groove has an etch profile considerably more gradual than the etch profile produced by prior art methods so that rupture of conductor paths along the upper edges of such gradually sloped grooves does not occur.

In certain embodiments of the invention, the Si substrate is orientated so that the 100-plane of its crystal lattice is within ± 20° of the surface thereof to be etched.

DESCRIPTION OF THE PREFERRED EMBODIMENTS

Generally, the invention provides a method of etching Si substrates to produce desired grooves or the like therein which have relatively gently sloping side walls so that when conductor paths are placed across such grooves, no rupture or break within the paths occur.

In accordance with the principles of the invention, a Si substrate is oriented so that the 100-plane of the crystal lattice thereof is substantially coincident with the surface thereof to be etched. In certain embodiments the Si-substrate is orientated so that the 100-plane of the crystal lattice is within ± 20° of the surface to be etched.

Thereafter, a suitable etch mask is applied onto the orientated surface so that select portions of the mask are protected while others are free for etchant attack. The etch mask is composed of a material selected from the group consisting of photolacquers (photo-resists), $Si_3N_4$, Mo, Ta, Nb, Pt, and Au.

Next, an etchant comprised of a mixture which for every 100 gr of $HNO_3$ therein contains 20 gr ± 50% of $H_2O$, 4 gr ± 100 of HF and 110gr ± 20% of $CH_3COOH$, is applied to the Si surface to be etched. The etchant utilized in the practice of the invention does not require further components, such as Br therein.

An etch temperature of about 18° to 30°C is maintained during the etch process and the etchant is allowed to remain in contact with the Si surface for a period of time sufficient to provide a desired etch or groove pattern thereon. Thereafter, the etchant is removed by rinsing with a suitable wash solution.

As workers skilled in the art will recognize, suitable etch times and wash solutions can be readily determined by routine and conventional procedures.

Figure 1:
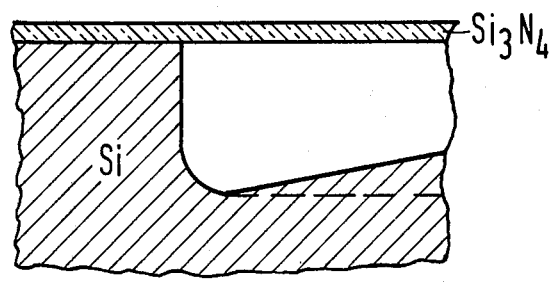
FIG. 1 is a partial elevated cross-sectional view of an etched profile produced by prior art means.
Figure 2:
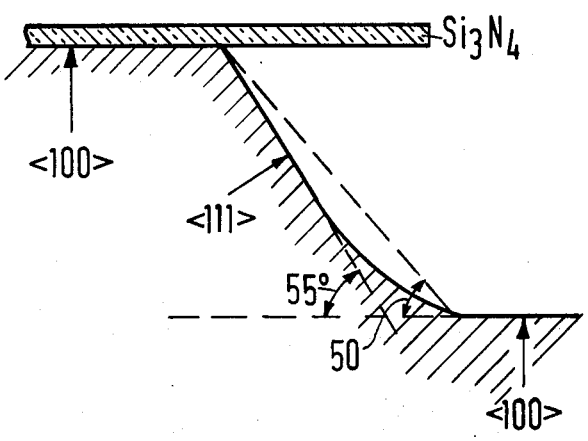
FIG. 2 is a somewhat similar view of an etched profile produced in accordance with the principles of the invention.

As shown at FIG. 2, a finished etch profile produced in accordance with the invention has a considerably more gently sloped side wall (so that the angle between the resulting side wall and the masked orientated surface is larger than about 90°) in relation to that attained by prior art means, such as shown at FIG. 1. Oxidation of the so-produced groove surfaces does not, of course, increase the steepness of the side walls thereof so that even the thinnest conductor paths may be placed across such groove surfaces without danger of rupture. In addition, the conductor paths may be operated at higher temperatures during circuit operation without any danger of rupture.

In the preferred embodiments of the invention, the following optimum steps are utilized:

1. The Si-substrate is orientated so that the 100-plane of the crystal lattice thereof coincides with the surface thereof to be etched;
2. The etchant utilized is composed of a mixture consisting of, on a 234 gr batch basis, 100 gr $HNO_3$, 20 gr of $H_2O$, 110 gr of $CH_3COOH$ and 4 gr of HF; and
3. An etch temperature of 22°C is maintained on the substrate and etchant until the etch process is complete.

It is to be noted that if improper orientation of the Si-substrate takes place, for example if the 111-plane thereof coincides with the surface to be etched, steeply angled side walls or even overhanging profiles are produced, even if all other perimeters, including etchant, of the invention are utilized. However, with proper orientation, i.e. attaining a coincidence or near coincidence between the 100-plane and the surface to be etched, gently sloping side walls are attained.

The invention thus provides a method of localized etching of Si-crystals or substrates which comprises orientating the 100-plane of the crystal lattice with the surface to be etched, applying a protective etch mask on select areas of such surface and contacting the surface with an etchant comprised of a mixture composed of $HNO_3$ (nitric acid), HF (hydrofluoric acid), $CH_3COOH$ (acetic acid) and $H_2O$ (water) wherein for each 100 gr of $HNO_3$ present in the mixture, 20 gr ± 50% of $H_2O$, 4 gr±100 of HF and 110 gr±20% of $CH_3COOH$ are present in the mixture, for a period of time sufficient to produce a desired etch pattern in the Si-surface. Each etched recess has side walls which are obliquely inclined relative to the surface being etched. In certain embodiments of the invention, the etching is conducted at a temperature in the range of 18° to 30°C.

In certain other embodiments of the invention, a groove or trench-like recess is produced on a Si substrate (in accordance with the method set forth above) between two elements of a circuit arrangement on the Si substrate, an insulating layer, for example composed of $SiO_2$, is placed within the so-produced trench-like recess so as to extend beyond both sides of the recess and a conductor path for electrically contacting the two elements on opposite sides of the groove is placed on the insulating layer and across the trench-like recess.

Although particular embodiments of the invention have been described and illustrated herein, it is recognized that modifications and variations may readily occur to those skilled in the art and consequently it is intended that the claims be interpretated to cover such modifications without departing from the spirit and scope of the invention.

I claim as my invention:

1. A process for producing a semiconductor arrangement from a monocrystalline silicon substrate for use in an integrated circuit, comprising:
    orientating a monocrystalline silicon substrate so that a (100)-plane of the silicon crystal lattice substantially coincides with a surface of the substrate being etched;
    applying a protective etch mask onto the orientated substrate surface to be etched, said etch mask having a pattern of groove-shaped openings therein; and
    contacting the masked orientated surface with a liquid etchant at a temperature in the range of about 18° to 30°C. and for a time period sufficient to from groove-shaped recesses in the masked orientated surface in accordance with said pattern of openings in the etch mask, said groove-shaped recesses having side walls which are obliquely inclined relative to the masked orientated surface so that the angle between the masked orientated surface and said side walls is larger than about 90°, said liquid etchant being composed of a mixture of HF, $HNO_3$, $CH_3COOH$ and $H_2O$ wherein for every 4 gr of HF present in said mixture, there are 100 gr of $HNO_3$, 110 gr ± 20% of $CH_3COOH$ and 20 gr ± 50% of $H_2O$.

2. A method as defined in claim 1 wherein said temperature is 22°C.

3. A method as defined in claim 1 wherein said protective etch mask is composed of a material selected from the group consisting of photolacquers, $Si_3N_4$, Mo, Ta, Nd and Au.

4. A method as defined in claim 1 wherein said etchant is composed of a mixture consisting of, on a 234 gr batch basis, 100 gr of $HNO_3$, 20 gr of $H_2O$, 110 gr of $CH_3COOH$ and 4 gr of HF.

5. A method as defined in claim 1 including etching a trench-like recess between two elements of a circuit arrangement on said substrate, said trench-like recess forming a portion of the recesses etched in the substrate surface;
    applying an insulating layer of $SiO_2$ in said trench-like recess so that said insulating layer extends beyond both sides of said recess; and
    applying an electrical conductor path onto said insulating layer and across said recess so as to electrically connect said elements on opposite sides of said recess.

* * * * *